United States Patent
Gui et al.

(10) Patent No.: US 6,589,676 B1
(45) Date of Patent: Jul. 8, 2003

(54) CORROSION RESISTANT MAGNETIC THIN FILM MEDIA

(75) Inventors: Jing Gui, Fremont, CA (US); Raj Thangaraj, Fremont, CA (US); Roger Alan Ristau, Livermore, CA (US); Samuel Dacke Harkness, IV, San Francisco, CA (US); Gary Clark Rauch, Pleasanton, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/902,600

(22) Filed: Jul. 12, 2001

Related U.S. Application Data

(60) Provisional application No. 60/221,258, filed on Jul. 25, 2000.

(51) Int. Cl.$^7$ .............................. G11B 5/66; G11B 5/70; B05D 5/12; C23C 14/34; C23C 14/48
(52) U.S. Cl. .................. 428/694 TP; 428/694 TM; 428/216; 428/336; 428/900; 427/130; 427/131; 427/528; 427/531; 204/192.1; 204/192.2
(58) Field of Search .............. 428/694 TP, 694 TM, 428/694 TR, 900, 213, 216, 336; 427/130, 131, 528, 531; 204/192.1, 192.2

(56) References Cited

U.S. PATENT DOCUMENTS

| | | | | |
|---|---|---|---|---|
| 4,774,130 A | * | 9/1988 | Endo et al. .................. 428/216 |
| 4,803,130 A | * | 2/1989 | Skorjanec et al. ......... 204/192.2 |
| 4,824,539 A | * | 4/1989 | Komoda et al. .......... 204/192.2 |
| 5,091,269 A | * | 2/1992 | Kondo et al. ................ 428/695 |
| 5,143,794 A | | 9/1992 | Suzuki et al. ................ 428/611 |
| 5,665,478 A | | 9/1997 | Suzuki et al. ................ 428/611 |
| 5,744,256 A | | 4/1998 | Goda et al. .............. 428/694 T |
| 6,218,028 B1 | * | 4/2001 | Song et al. .................. 428/611 |

* cited by examiner

Primary Examiner—Holly Rickman
(74) Attorney, Agent, or Firm—McDermott, Will & Emery

(57) ABSTRACT

Corrosion resistant magnetic thin film media are fabricated using a CoCr magnetic layer having a stabilized protective chromium oxide film thereon. Stabilization of the protective chromium oxide film is achieved by incorporating a stabilizing element, such as Mo, V, Mn, Nb, Ni or Si, in the magnetic layer, thereby enabling elimination of the protective overcoat, e.g., C-containing protective overcoat, or forming the protective overcoat at a significantly low thickness of less than about 20 Å, e.g., up to about 1 Å. Embodiments include forming a magnetic layer comprising Co and Cr on an underlayer, and then forming a thin magnetic layer containing Co and Cr with the chromium oxide stabilizing element thereon. Embodiments further include introducing the chromium oxide stabilizing element by diffusion or ion implantation into a sputter deposited Co—Cr magnetic alloy layer.

19 Claims, 3 Drawing Sheets

CORROSION RESISTANT MAGNETIC THIN FILM MEDIA

RELATED APPLICATION

This application claims priority from Provisional Patent Application Serial No. 60/221,258 filed Jul. 25, 2000 entitled "COROSION RESISTANT MAGNETIC THIN FILM MEDIA", the entire disclosure of which is hereby incorporated by reference herein.

TECHNICAL FIELD

The present invention relates to magnetic recording media, particularly rotatable recording media, such as thin film magnetic disks cooperating with a magnetic transducer head, particularly a magnetoresistive (MR) or a giant magnetoresistive (GMR) head. The present invention has particular applicability to high areal density magnetic recording media designed for drive programs having reduced flying height, or pseudo-contact/proximity recording.

BACKGROUND ART

Thin film magnetic recording disks and disk drives are conventionally employed for storing large amounts of data in magnetizable form. In operation, a typical contact start/stop (CSS) method commences when a data-transducing head begins to slide against the surface of the disk as the disk begins to rotate. Upon reaching a predetermined high rotational speed, the head floats in air at a predetermined distance from the surface of the disk where it is maintained during reading and recording operations. Upon terminating operation of the disk drive, the head again begins to slide against the surface of the disk and eventually stops in contact with and pressing against the disk. Each time the head and disk assembly is driven, the sliding surface of the head repeats the cyclic operation consisting of stopping, sliding against the surface of the disk, floating in the air, sliding against the surface of the disk and stopping.

For optimum consistency and predictability, it is necessary to maintain each transducer head as close to its associated recording surface as possible, i.e., to minimize the flying height of the head. Accordingly, a smooth recording surface is preferred, as well as a smooth opposing surface of the associated transducer head. However, if the head surface and the recording surface are too smooth, the precision match of these surfaces gives rise to excessive stiction and friction during the start up and stopping phases, thereby causing wear to the head and recording surfaces, eventually leading to what is referred to as a "head crash." Thus, there are competing goals of reduced head/disk friction and minimum transducer flying height.

Conventional practices for addressing these apparent competing objectives involve providing a magnetic disk with a roughened recording surface to reduce the head/disk friction by techniques generally referred to as "texturing." Conventional texturing techniques involve mechanical polishing or laser texturing the surface of a disk substrate to provide a texture thereon prior to subsequent deposition of layers, such as an underlayer, a magnetic layer, a protective overcoat, and a lubricant topcoat, wherein the textured surface on the substrate is intended to be substantially replicated in the subsequently deposited layers. The surface of an underlayer can also be textured, and the texture substantially replicated in subsequently deposited layers.

Conventional longitudinal recording media typically comprise a substrate, such as aluminum (Al) or an Al alloy, e.g., aluminum-magnesium (Al—Mg) alloy, plated with a layer of amorphous nickel-phosphorus (NiP). Alternative substrates include glass, ceramic, glass-ceramic, and polymeric materials and graphite. The substrate typically contains sequentially deposited on each side thereof at least one seedlayer and/or at least one underlayer, such as chromium (Cr) or a Cr-alloy, e.g., chromium vanadium (CrV), a cobalt (Co)-base alloy magnetic layer, a protective overcoat typically containing carbon, and a lubricant. The underlayer, magnetic layer and protective overcoat, are typically sputter deposited in an apparatus containing sequential deposition chambers. A conventional Al-alloy substrate is provided with a NiP plating, primarily to increase the hardness of the Al substrate, serving as a suitable surface to provide a texture, which is substantially reproduced on the disk surface.

Conventional practices further include forming a servo pattern on the magnetic layer thereby producing topographical nonuniformities, such servo patterns can be formed by photolithographic or laser techniques.

In accordance with conventional practices, a lubricant topcoat is uniformly applied over the protective overcoat to prevent wear between the disk and head interface during drive operation. Excessive wear of the protective overcoat increases friction between the head and disk, thereby causing catastrophic drive failure. Excess lubricant at the head-disk interface causes high stiction between the head and disk. If stiction is excessive, the drive cannot start and catastrophic failure occurs. Accordingly, the lubricant thickness must be optimized for stiction and friction.

A conventional material employed for the lubricant topcoat comprises a perfluoro polyether (PFPE) which consists essentially of carbon, fluorine and oxygen atoms. The lubricant is typically dissolved in an organic solvent, applied and bonded to the carbon overcoat of the magnetic recording medium by techniques such as dipping, buffing, thermal treatment, ultraviolet (UV) irradiation and soaking.

The escalating requirements for high areal recording density impose increasingly greater requirements on thin film magnetic recording media in terms of coercivity, stiction, squareness, medium noise and narrow track recording performance. In addition, increasingly high areal recording density and large-capacity magnetic disks require smaller flying heights, i.e., the distance by which the head floats above the surface of the disk in the disk drive (head-disk interface). For conventional media design, a decrease in the head to media spacing increases stiction and drive crash, thereby imposing an indispensable role on the carbon-protective overcoat.

There are various types of carbon, some of which have been employed for a protective overcoat in manufacturing a magnetic recording medium. Such types of carbon include hydrogenated carbon, graphitic carbon or graphite, and nitrogenated carbon or carbon nitride and hydrogen-nitrogenated carbon. These types of carbon are well known in the art and, hence, not set forth herein in great detail.

The drive for high areal recording density and, consequently, reduced flying heights, challenges the capabilities of conventional manufacturing practices. For example, a suitable protective overcoat must be capable of preventing corrosion of the underlying magnetic layer, which is an electrochemical phenomenon dependent upon factors such as environmental conditions, e.g., humidity and temperature. In addition, a suitable protective overcoat must prevent migration of ions, such as cobalt (Co) and nickel (Ni), from underlying layers into the lubricant topcoat and to the surface of the magnetic recording medium forming defects such as asperities. A protective overcoat must also exhibit the requisite surface for wear resistance, lower stiction, and some polarity to enable bonding thereto of a lubricant topcoat in an adequate thickness.

The continuing drive for increased recording areal density in the magnetic recording media industry mandates reduction of the thickness of the protective overcoats, e.g., the carbon protective overcoat and lubricant film, since such layers constitute part of the head-medium separation. In order to satisfy the continuing drive for higher recording areal densities, the head-medium separation requirement at, for example, 100 Gb/in$^2$ recording areal density, the protective overcoat thickness must be as low as 20 Å, and the lubricant film thickness must be as low as 10 Å. However, at such extreme low thicknesses, significant issues arise in that the continuity and integrity of the protective and lubricant films are difficult to maintain. Consequently, imperfections in the protective overcoats increase leading to degradation of recording performance due to environmental attacks, such as corrosion. Thus, the corrosion problem prevents reduction of protective overcoats to a thickness less than the physical limit below which the films are no longer continuous, thereby significantly limiting reduction of the head-medium separation required to increase areal recording density.

Another problem confronting the drive for increased areal recording density leading to corrosion problems stems from the formation of topographical patterns on the substrate and/or magnetic layer which are substantially reproduced in overlying layers. In order to increase areal recording density, both bit density and track density must be increased. However, when increasing track density to a high level, e.g., greater than 100,000 tracks per inch, the track becomes too narrow to be formed by conventional servo track writing techniques. Lithographic patterning techniques have been employed to create fine topographical patents on a disk for servo purposes, wherein the track density can be increased significantly beyond 100,000 tracks per inch. However, the formation of such topographical patterns renders the medium more susceptible to environmental attacks, because it is extremely difficult to cover the surface of the magnetic layer containing such lithographic features with a thin layer of a protective overcoat, such as carbon, in addition to a thin lubricant layer.

Accordingly, there exists a need for magnetic recording media having a high recording areal density, and a significantly reduced head-medium separation while simultaneously providing adequate resistance to environmental attacks, such as corrosion, and for enabling methodology. There exists a particular need for high recording areal density magnetic recording media having a combined protective overcoat lubricant film thickness less than 30 Å and exhibiting corrosion resistance, and enabling methodology.

DISCLOSURE OF THE INVENTION

An advantage of the present invention is a magnetic recording medium having a combined protective overcoat and lubricant film thickness less than about 30 Å and exhibiting resistance to corrosion.

Another advantage of the present invention is a method of manufacturing a magnetic recording medium having a combined protective overcoat and lubricant film thickness less than about 30 Å and exhibiting corrosion resistance.

Additional advantages and other features of the present invention will be set forth in part in the description which follows and in part will become apparent to those having ordinary skill in the art upon examination of the following disclosure or may be learned from the practice of the present invention. The advantages of the present invention may be realized and obtained as particularly pointed out in the appended claims.

According to the present invention, the foregoing and other advantages are achieved in part by a magnetic recording medium comprising: a non-magnetic substrate; an underlayer over the substrate; a first magnetic layer, comprising: cobalt (Co), chromium (Cr) and a chromium oxide stabilizing element, over the underlayer; a stabilized chromium oxide film on the first magnetic layer; and an optional protective overcoat, having a thickness no greater than about 20 Å, on the stabilized chromium oxide film.

Embodiments of the present invention include forming a second magnetic layer containing Co and Cr, having a thickness greater than that of the first magnetic layer, between the underlayer and the first magnetic layer. The second magnetic layer can be optimized for magnetic performance and, hence, may not contain an element for stabilizing the chromium oxide film or can contain such an element but in an amount optimized for magnetic performance and, hence, may not be effective for stabilizing the chromium oxide film. Embodiments of the present invention further include forming a lubricant topcoat at a thickness no greater than about 10 Å directly on the protective overcoat. Other embodiments of the present invention include forming a lubricant topcoat on the stabilized chromium oxide film without a protective overcoat therebetween. The stabilized chromium oxide film is typically formed at a thickness of about 2 Å to about 10 Å. Suitable chromium oxide stabilizing elements include at least one element selected from the group consisting of molybdenum (Mo), vanadium (V), manganese (Mn), niobium (Nb), nickel (Ni) and silicon (Si).

Another aspect of the present invention is a method of manufacturing a magnetic recording medium, the method comprising: forming an underlayer over a non-magnetic substrate; forming a first magnetic layer, comprising Co, Cr and a chromium oxide stabilizing element, over the underlayer, the magnetic layer having a stabilizing chromium oxide film thereon; and forming an optional protective overcoat, having a thickness no greater than about 20 Å, on the stabilized chromium oxide film. Embodiments of the present invention further include forming a second magnetic layer containing Co and Cr, at a thickness greater than that of the first magnetic layer, between the underlayer and the first magnetic layer. The first magnetic layer can be formed by sputter depositing a layer comprising Co and Cr and then introducing the chromium oxide stabilizing element therein, as by ion implantation or by depositing a thin film of the chromium oxide stabilizing element on the first magnetic layer and heating to diffuse the chromium oxide stabilizing element into the sputter deposited layer of Co and Cr.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 4, similar elements or features are denoted by similar reference numerals.

DESCRIPTION OF THE INVENTION

The present invention addresses and solves problems generated when attempting to manufacture high recording areal density magnetic recording media having a sufficiently reduced head-medium separation, particularly corrosion problems. The present invention achieves that objective by strategically forming a corrosion resistant magnetic alloy layer. Current magnetic thin film media employed in the magnetic recording industry comprise Co and Cr alloy systems, such as Co, Cr, tantalum (Ta), Co, Cr, platinum (Pt), Ta and Co, Cr, Pt boron (B). After experimentation and investigation it was found that under normal operating conditions, a thin chromium oxide passivation film forms on the surface of the magnetic layer that can effectively stop media corrosion. However, it was also found that when subjected to severe environmental conditions, such as elevated temperatures and elevated humilities, or a corrosive atmosphere, such as an atmosphere containing chlorine, fluorine, sulfur or sulfur oxides, the chromium oxide passivation film breaks down, thereby accelerating corrosion of the medium.

Having determined that the magnetic recording medium corrodes after the chromium oxide passivation film breaks down, it was further recognized that high recording areal density magnetic recording media can be produced with a sufficiently low head-medium separation, without concern for the continuity or effectiveness of the protective layers, by stabilizing the chromium oxide passivation layer. Thus, efforts were made to enhance the stability of the chromium oxide passivation layer formed on a Co, Cr magnetic alloy layer.

Co and iron (Fe) are both transition metals exhibiting many similarities in their physical and chemical properties. It was determined that the chromium oxide passivation film on stainless steels consists essentially of chromium oxide and is chemically similar to the chromium oxide passivation film that forms on a magnetic alloy layer of a magnetic recording medium. Efforts were then made to introduce a small amount of a chromium oxide stabilizing element into the magnetic alloy layer containing Co and Cr to produce a magnetic thin film medium that is inherently resistant to corrosion. By providing a magnetic recording medium that is inherently resistant to corrosion, the concerns associated with forming discontinuous protective layers of poor integrity and vulnerability to environmental attacks are avoided, thereby enabling the formation of magnetic recording media containing a sufficiently reduced head-mediumn separation for high recording areal densities.

Figure 5:
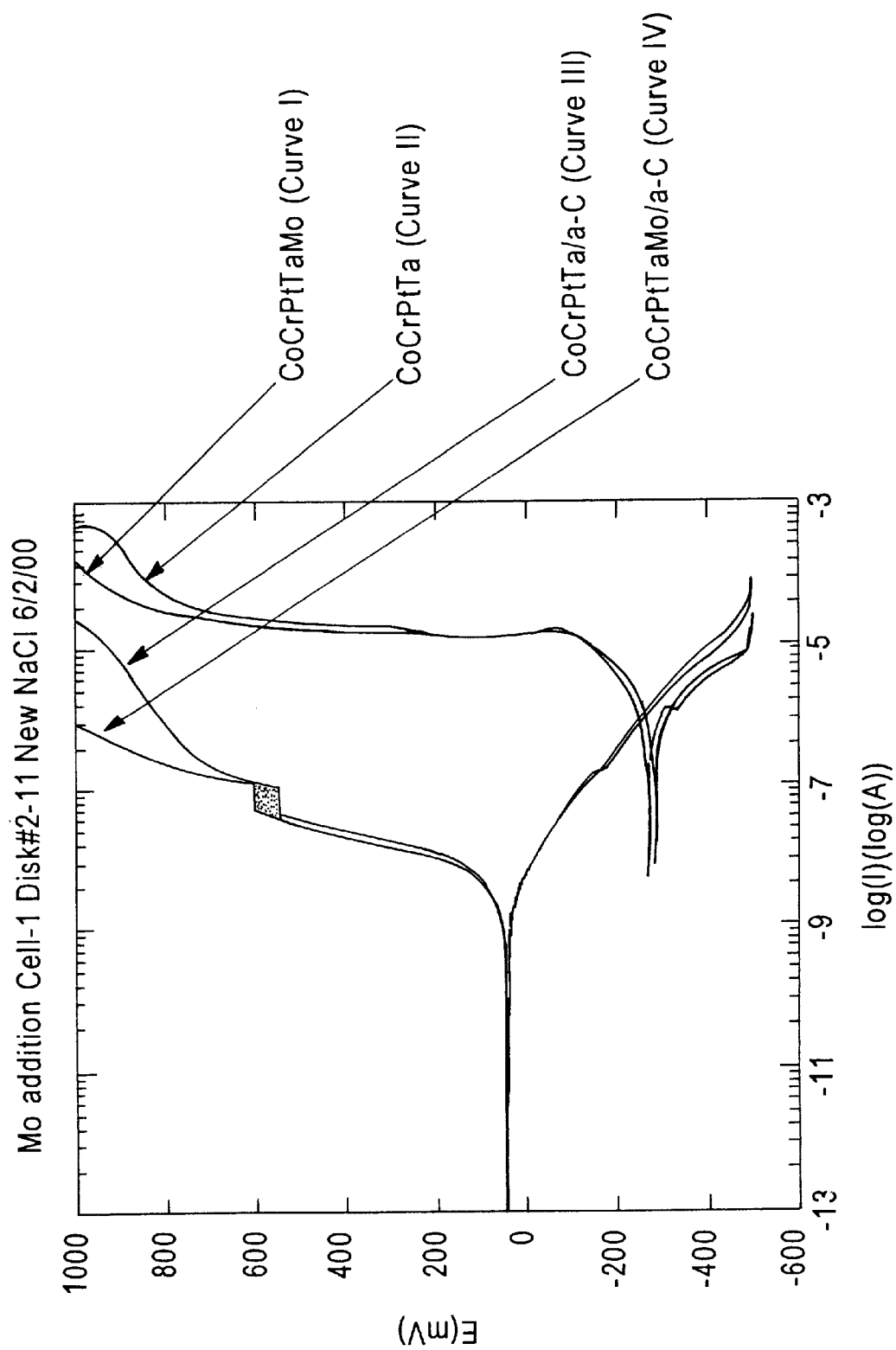
FIG. 5 is a potentiodynamic scans illustrating the effectiveness of the present invention.

Experimentation and investigation confirmed that magnetic recording media can be manufactured with a magnetic thin film that is inherently resistant to corrosion and the data of potentiodynamic scans in 0.1N NaCl shown for a CoCrPtTa magnetic alloy without a carbon overcoat, a CoCrPtTaMo magnetic alloy layer without a carbon overcoat, a CoCrPtTa/amorphous carbon overcoat and for a CoCrPtTaMo/amorphous carbon overcoat, are shown in FIG. 5.

In a potentiodynamic scan, a sample (e.g., disk) is exposed to an aqueous solution (e.g., NaCl solution). An external voltage is applied to the sample-solution interface to force charges passing through the interface. When voltage (the vertical axis) is very negative, the current (the horizontal axis in log scale) results from $H_2O/O_2$ reduction. As the voltage steps up into more positive values, the current initially drops to zero ($<10^{-10}$ A) before it rises again, which signals the oxidation processes (i.e., corrosion) start to occur. At any fixed voltage, the current indicates the corrosion rate under this bias. For example, at 400 mV two samples without carbon overcoat show much higher corrosion current than two samples with overcoats ($10^{-5}$ vs. $10^{-7}$). It is noted that within a wide range of voltage, e.g., from 0 to 600 mV, corrosion current is relatively independent of applied voltage. This behavior is called passivation, indicating corrosion is under control by a protective film (oxide, overcoat, or both). When the voltage is sufficiently high, this protective film can break down, leading to a sudden acceleration of corrosion rate (e.g., 800 mV for curve II, 700 mV for curve III). More importantly, when a protective film breaks down, it usually occurs in localized areas, which leads to the most damaging corrosion failure, pitting. This breakdown voltage provides a good indication to the quality of the protective film. It can be seen from the graph above that, adding some Mo into the magnetic alloy significantly enhances the stability of the protective film. The Mo containing sample without overcoat (curve I) shows some sign of breakdown only at 100 mV, whereas the Mo containing sample with overcoat (curve IV) shows no sign of breakdown.

The data illustrate that the addition of 3.5 at. % of Mo to a CoCrPtTa magnetic alloy layer dramatically improves the stability of the chromium oxide passivation film formed on the surface, of the magnetic alloy layer. Due to inherent corrosion resistance, media formed with such magnetic alloy layers do not exhibit degradation even if the protective overcoats are discontinuous. In fact, the present invention enables the manufacture of magnetic recording media that do not have external protective overcoats, such as conventional carbon-containing protective overcoats but exhibit corrosion resistance and resistance to environmental attacks.

Embodiments of the present invention comprise magnetic recording media having conventional overcoats, conventional seedlayers and/or underlayers, but a strategically formulated magnetic alloy layer containing Co and Cr and a suitable amount of a chromium oxide stabilizing element, such as about 1 at. % to about 50 at. %, e.g., about 3 at. % to about 6 at. %. Typically, the magnetic alloy layer contains in excess of 10 at. % chromium. Suitable chromium oxide stabilizing elements include Mo, V, Mn, Nb, Ni and Si. Embodiments of the present invention comprise forming magnetic recording media having a stabilized chromium oxide film formed on a magnetic layer, wherein the stabilized chromium oxide film has a thickness of about 2 Å to about 10 Å. Chromium oxide film is typically amorphous in structure.

Embodiments of the present invention enable manufacture of magnetic recording media without a protective overcoat, such as a carbon-containing protective overcoat, formed on the magnetic layer due to the stabilized chromium oxide film formed on the magnetic layer. Embodiments of the present invention also include an optional protective overcoat, having a thickness no greater than about 20 Å, e.g., no greater than about 1 Å, on the stabilized chromium oxide film. Embodiments of the present invention further include forming a lubricant topcoat, having a thickness no greater than about 10 Å, on the protective overcoat. Alternatively, the lubricant topcoat can be formed directly on the stabilized chromium oxide film without a protective overcoat therebetween.

In other embodiments of the present invention, a magnetic alloy layer containing Co and Cr is formed at a conventional thickness, such as about 50 Å to about 500 Å, e.g., about 80 Å, and contains elements optimized for magnetic performance. A second magnetic alloy layer is then formed, at a thickness less than the first magnetic alloy layer, but containing an element optimized for stabilizing the chromium oxide passivation film. Thus, embodiments of the present invention include forming a magnetic alloy layer containing Co and Cr, not optimized for corrosion resistance, on an underlayer at a thickness of about 50 Å to about 500 Å and forming another magnetic layer, optimized for corrosion resistance and containing the element for stabilizing the chromium oxide passivation film, at a thickness of about 3 Å to about 15 Å.

Embodiments of the present invention comprise forming the magnetic alloy layer optimized for corrosion resistance by sputter depositing a magnetic alloy layer containing Co and Cr and then introducing the chromium oxide stabilizing element therein. Embodiments of the present invention comprise introducing the chromium oxide stabilizing element by ion implantation or by depositing a thin film containing the chromium oxide stabilizing element on the magnetic alloy layer and then heating to diffuse the chromium oxide stabilizing element into the sputter deposited magnetic layer.

Figure 1:
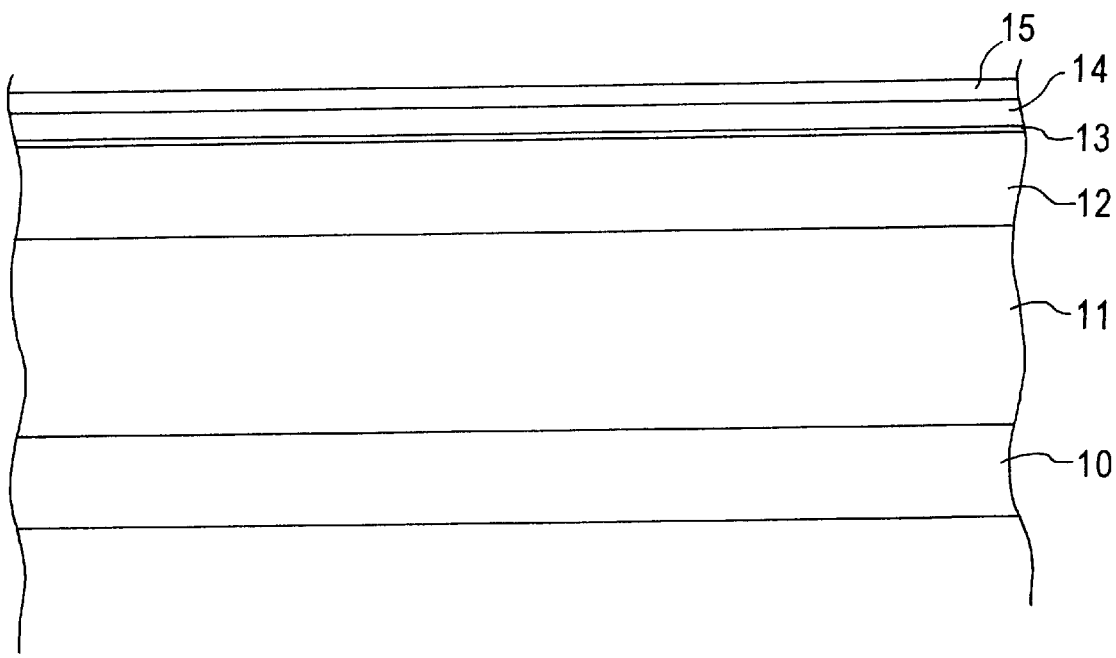
FIG. 1 schematically illustrates a magnetic recording medium in accordance with an embodiment of the present invention.

An embodiment of the present invention is schematically illustrated in FIG. 1 and comprises a conventional substrate 10, and conventional seedlayer(s) and/or underlayer(s) 11 formed on the substrate 10. A magnetic alloy layer 12 is then deposited on the seedlayer/underlayer system 11. Magnetic alloy layer 12 comprises Co and Cr and contains an amount of a chromium stabilizing element sufficient to form a chromium oxide passivation film 13 thereon. An optional protective overcoat 14, such as a carbon-containing protective overcoat, can then be formed and a lubricant topcoat 15 formed on the protective overcoat 14. Protective overcoat 14 can be formed at a minimal thickness, such as less than about 20 Å, e.g., less than about 1 Å, thereby enabling a significant reduction in the head-medium spacing and, consequently, an increase in recording areal density. Thus, embodiments of the present invention include magnetic recording media having very thin protective overcoats that are discontinuous and, hence, would otherwise render the magnetic recording media vulnerable to corrosion and environmental attack but for the presence of the stabilized chromium oxide passivation film 13. Embodiments of the present invention further include omitting the protective overcoat 14 completely and forming the lubricant topcoat 15 directly on the stabilized chromium oxide passivation film 13.

Figure 3:
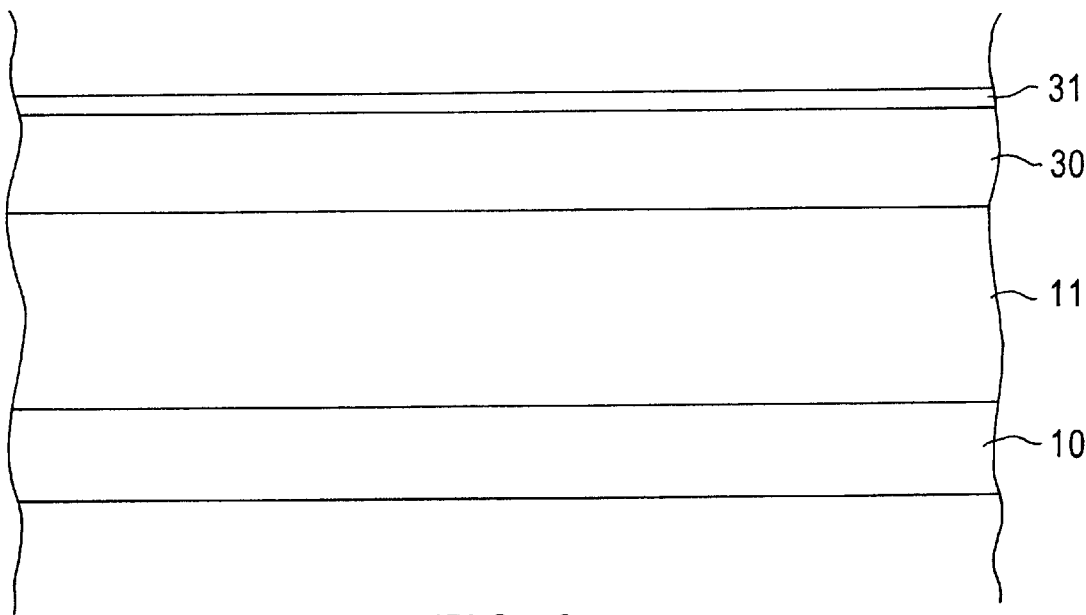
FIG. 3 schematically illustrates a phase in a method of manufacturing the magnetic recording medium schematically illustrated in FIG. 1.

A method of manufacturing the magnetic recording medium schematically illustrated in FIG. 1 comprises sequentially sputter depositing the seedlayer/underlayer system 11 on the non-magnetic substrate, and then sputter depositing a magnetic alloy layer 30 containing Co and Cr, without the chromium oxide stabilizing element, as schematically illustrated in FIG. 3. A thin film 31 containing the chromium oxide stabilizing element is then formed on the upper surface of the sputter deposited CoCr alloy layer 30, followed by heating to diffuse the chromium oxide stabilizing element into sputter deposited layer 30, thereby forming magnetic alloy layer 12 (FIG. 1). Alternatively, the chromium oxide stabilizing element can be introduced into CoCr alloy layer 30 (FIG. 3) by ion implantation.

In another embodiment of the present invention, the magnetic alloy layer 12, schematically shown in FIG. 1, can be formed by sputtering an alloy target containing all of the elements, including the chromium oxide passivation film stabilizing element, or by cosputtering a Co—Cr alloy target with a target that contains the chromium oxide passivation film stabilizing element or elements.

Figure 2:
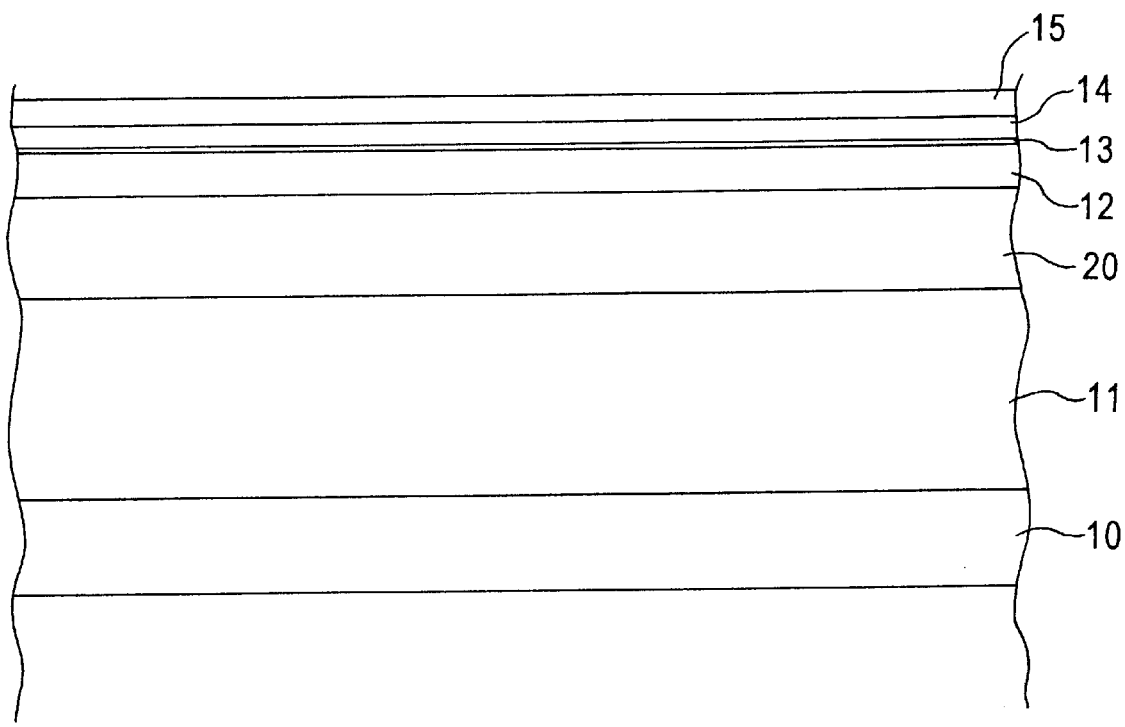
FIG. 2 schematically illustrates a magnetic recording medium in accordance with another embodiment of the present invention.
Figure 4:
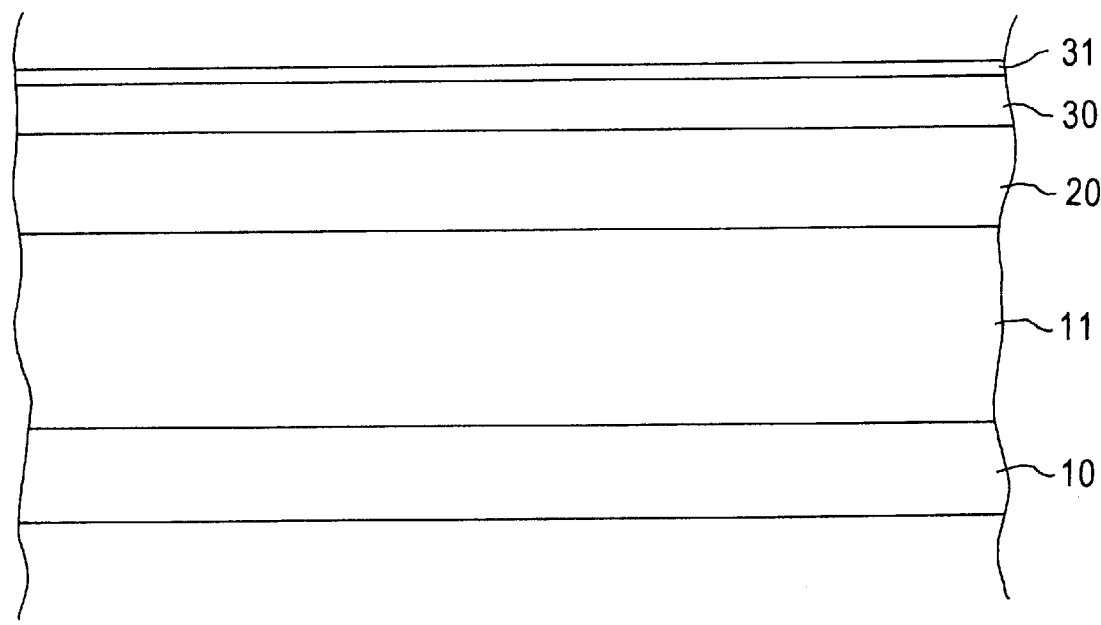
FIG. 4 illustrates a phase in a method of manufacturing the magnetic recording medium schematically illustrated in FIG. 2.

In another embodiment of the present invention, schematically illustrated in FIG. 2, a CoCr magnetic alloy layer 20 is sputter deposited on the seedlayer/underlayer system 11 containing alloying elements optimized for magnetic performance. A thinner CoCr alloy layer 12 is then sputter deposited on magnetic alloy layer 20. Magnetic alloy layer 12 contains the chromium oxide passivation film stabilizing element in an amount sufficient to stabilize chromium oxide passivation film 13 formed thereon. Magnetic alloy layer 20 can be formed by sputtering an alloy target containing all of the elements, cosputtering a CoCr alloy target with a target that contains the chromium oxide passivation film stabilizing element, or by ion implanting the chromium oxide passivation film stabilizing element into a sputter deposited layer of Co and Cr. In another embodiment, as shown in FIG. 4, a layer comprising Co and Cr 30 is sputter deposited on magnetic alloy layer 20 and a thin layer 31 of the chromium oxide passivation layer stabilizing element is deposited on sputter deposited magnetic alloy layer 30. Heating is then conducted to diffuse the stabilizing element into sputter deposited layer 30 to form layer 12 as shown in FIG. 2 on which the stabilized chromium oxide film 13 is formed in use.

The formation of inherently corrosion resistant magnetic alloy layers in accordance with embodiments of the present invention enables the formation of textured substrates and/or textured magnetic alloy layers containing various servo patterns, such as formed by photolithographic or laser techniques, without environmental concerns, such as corrosion problems. The present invention provides magnetic recording media exhibiting a significantly reduced head-medium interface, thereby achieving high recording areal densities, such in excess of 100 Gb/in$^2$. Embodiments of the present invention enable the formation of corrosion resistant high areal density magnetic recording media with or without a protective overcoat having a thickness no greater than 20 Å, and tolerating discontinuities without corrosion concerns.

It should be recognized that in FIGS. 1 through 4, layers are depicted as formed sequentially on one side of substrate 10. However, consistent with conventional practices, the depicted layers are formed on both sides of the substrate but have been omitted from FIGS. 1 through 4 for illustrative convenience. It should also be recognized that magnetic alloy layers suitable for use in the present invention include various Co—Cr alloy systems. The present invention is not limited to any particular substrate material, seedlayer material, underlayer material, or number of seedlayers and underlayers, or to any particular optional protective overcoat or lubricant topcoat. Magnetic recording media in accordance with the present invention can be manufactured in conventional sputtering apparatus, including DC single disk sputtering apparatuses as well as in-line passby systems.

The present invention enjoys industrial utility in manufacturing any of various types of magnetic recording media, including thin film disks. The present invention is particularly applicable in producing high recording areal density magnetic recording media requiring a low flying height and exhibiting resistance to environmental attacks, such as corrosion.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A magnetic recording medium comprising:
   a non-magnetic substrate;
   an underlayer over the substrate;
   a first magnetic layer, comprising cobalt (Co), chromium (Cr) and a chromium oxide stabilizing element, over the underlayer;
   a stabilized chromium oxide film on the first magnetic layer; and
   a protective overcoat, having a thickness up to about 20 Å, on the stabilized chromium oxide film.

2. The magnetic recording medium according to claim 1, wherein the protective overcoat is present at a thickness up to about 1 Å.

3. The magnetic recording medium according to claim 2, further comprising a lubricant topcoat, having a thickness up to about 10 Å, on the protective overcoat.

4. A magnetic recording medium comprising:
   a non-magnetic substrate;
   an underlayer over the substrate;
   a first magnetic layer, comprising cobalt (Co), chromium (Cr) and a chromium oxide stabilizing element, over the underlayer;
   a stabilized chromium oxide film on the first magnetic layer; and
   a lubricant topcoat, having a thickness no greater than about 10 Å, formed on the stabilized chromium oxide film without a protective overcoat therebetween.

5. The magnetic recording medium according to claim 1, wherein the stabilized chromium oxide film has a thickness of about 2 Å to about 10 Å.

6. The magnetic recording medium according to claim 1, comprising a second magnetic layer containing Co and Cr, having a thickness greater than that of the first magnetic layer, between the underlayer and the first magnetic layer.

7. The magnetic recording medium according to claim 6, wherein:
   the first magnetic layer has a thickness of about 3 Å to about 10 Å; and
   the second magnetic layer has a thickness of about 50 Å to about 500 Å.

8. The magnetic recording medium according to claim 6, wherein the chromium oxide stabilizing element comprises at least one element selected from the group consisting of molybdenum (Mo), vanadium (V), manganese (Mn), niobium (Nb), nickel (Ni) and silicon (Si).

9. The magnetic recording medium according to claim 6, wherein the substrate comprises a surface pattern formed thereon.

10. The magnetic recording medium according to claim 6, wherein the second magnetic layer comprises a surface pattern formed thereon.

11. The magnetic recording medium according to claim 4, comprising a second magnetic layer containing Co and Cr, having a thickness greater than that of the first magnetic layer, between the underlayer and the first magnetic layer.

12. The magnetic recording medium according to claim 1, wherein the chromium oxide stabilizing element comprises at least one element selected from the group consisting of molybdenum (Mo), vanadium (V), manganese (Mn), niobium (Nb), nickel (Ni) and silicon (Si).

13. The magnetic recording medium according to claim 1, wherein:
   The first magnetic layer comprises a surface pattern thereon, with the stabilized chromium oxide film formed on the surface pattern; and/or
   the substrate comprises a surface pattern formed thereon.

14. A method of manufacturing a magnetic recording medium, the method comprising:
   forming an underlayer over a non-magnetic substrate;
   forming a first magnetic layer, comprising cobalt (Co), chromium (Cr) and a chromium oxide stabilizing element, over the underlayer, the magnetic layer having a stabilized chromium oxide film thereon; and
   forming a protective overcoat, having a thickness up to about 20 Å, on the stabilized chromium oxide film.

15. The method according to claim 14, wherein the chromium oxide stabilizing element is at least one element selected from the group consisting of molybdenum (Mo), vanadium (V), manganese (Mn), niobium (Nb), nickel (Ni) and silicon (Si).

16. The method according to claim 14, comprising forming the first magnetic layer by:
   sputter depositing a layer comprising Co and Cr; and
   ion implanting the chromium oxide stabilizing element into the layer comprising Co and Cr.

17. The method according to claim 14, comprising forming the first magnetic layer by:
   sputter depositing a layer comprising Co and Cr;
   sputter depositing a film of the chromium oxide stabilizing element on the layer comprising Co and Cr; and
   heating to diffuse the chromium oxide stabilizing element into the layer comprising Co and Cr.

18. The method according to claim 14, comprising forming a second magnetic layer containing Co and Cr, having a thickness greater than that of the first magnetic layer, between the underlayer and the first magnetic layer.

19. The method according to claim 18, comprising:
   forming the first magnetic layer at a thickness of about 3 Å to about 15 Å; and
   forming the second magnetic layer at a thickness of about 50 Å to about 500 Å.

* * * * *